United States Patent
Makino et al.

(10) Patent No.: US 10,411,179 B2
(45) Date of Patent: Sep. 10, 2019

(54) THERMOELECTRIC POWER GENERATION MODULE

(71) Applicant: KELK Ltd., Hiratsuka-shi, Kanagawa (JP)

(72) Inventors: Kazuya Makino, Hiratsuka (JP); Shinichi Fujimoto, Hiratsuka (JP); Hirokuni Hachiuma, Hiratsuka (JP)

(73) Assignee: KELK Ltd., Kanagawa (JP)

( * ) Notice: Subject to any disclaimer, the term of this patent is extended or adjusted under 35 U.S.C. 154(b) by 0 days.

(21) Appl. No.: 15/544,185

(22) PCT Filed: Mar. 4, 2016

(86) PCT No.: PCT/JP2016/056848
§ 371 (c)(1),
(2) Date: Jul. 17, 2017

(87) PCT Pub. No.: WO2016/147918
PCT Pub. Date: Sep. 22, 2016

(65) Prior Publication Data
US 2017/0373238 A1    Dec. 28, 2017

(30) Foreign Application Priority Data
Mar. 13, 2015    (JP) .................................. 2015-050719

(51) Int. Cl.
*H01L 35/10*    (2006.01)
*H01L 35/32*    (2006.01)

(52) U.S. Cl.
CPC .............. *H01L 35/10* (2013.01); *H01L 35/32* (2013.01)

(58) Field of Classification Search
CPC ......... H01L 31/02; H01L 31/04; H01L 31/10; H01L 31/12; H01L 31/32; H01L 35/02;
(Continued)

(56) References Cited

U.S. PATENT DOCUMENTS

| 4,795,498 A * | 1/1989 | Germanton | G01K 7/04 136/201 |
| 5,824,561 A | 10/1998 | Kishi et al. | |
| 2010/0252084 A1 * | 10/2010 | Konishi | H01L 35/32 136/200 |

FOREIGN PATENT DOCUMENTS

| JP | H08-097472 | 4/1996 |
| JP | 2004-328013 | 11/2004 |

(Continued)

OTHER PUBLICATIONS

JP2008270421 (A)—Nov. 6, 2008, Kiyozawa Ko, english machine translation (Year: 2008).*

(Continued)

*Primary Examiner* — Susan D Leong
(74) *Attorney, Agent, or Firm* — Fish & Richardson P.C.

(57) ABSTRACT

A thermoelectric generation module has a cooling surface formed on one of a front side and a rear side and a heating surface formed on the other thereof. The thermoelectric generation module includes: a plurality of thermoelectric elements; a pair of flexible boards holding the thermoelectric elements therebetween and respectively defining the cooling surface and the heating surface; a plurality of interelement electrodes respectively provided on opposed surfaces of the flexible boards and configured to electrically connect the thermoelectric elements to each other; a lead wire configured to be electrically connected to an interelement electrode to which a terminal element located at an end of an electrical arrangement is connected; and a reinforcing pattern interposed between the flexible boards and being closer to the drawn-out lead wire with respect to the terminal element.

11 Claims, 18 Drawing Sheets

(58) Field of Classification Search
CPC ......... H01L 35/04; H01L 35/10; H01L 35/12; H01L 35/32
See application file for complete search history.

(56) References Cited

FOREIGN PATENT DOCUMENTS

| | | |
|---|---|---|
| JP | 2008-270421 | 11/2008 |
| JP | 2009-129968 | 6/2009 |
| JP | 2012-212839 | 11/2012 |

OTHER PUBLICATIONS

International Search Report and Written Opinion for International Application No. PCT/JP2016/056848, dated Apr. 12, 2016, 10 pages, with English translation.
International Preliminary Report of Patentability in International Application No. PCT/JP2016/056848, dated Sep. 19, 2017, 6 pages (with English translation).
Japanese Office Action in Japanese Application No. JP2015-050719, dated Apr. 23, 2019, 5 pages.

* cited by examiner

THERMOELECTRIC POWER GENERATION MODULE

CROSS-REFERENCE TO RELATED APPLICATIONS

This application claims priority to International Application No. PCT/JP2016/056848 filed on Mar. 4, 2016, which claims priority to Japanese Application No. 2015-050719, filed Mar. 13, 2015, the contents of which are incorporated herein in their entirety.

TECHNICAL FIELD

The present invention relates to a thermoelectric generation module, more specifically, a thermoelectric generation module including flexible boards opposed to each other and a plurality of thermoelectric elements interposed between the flexible boards.

BACKGROUND ART

A thermoelectric generation module is configured to generate electricity with use of a temperature difference between two objects according to Seebeck effect. An example of typically known thermoelectric generation modules is disclosed in Patent Literature 1.

The thermoelectric generation module disclosed in Patent Literature 1 has a so-called Π (pi)-type structure in which a plurality of thermoelectric elements planarly arranged and electrically connected in series by electrodes are interposed between flexible boards opposed to each other. A lead wire is connected to each end of the series circuit including the thermoelectric elements and the electrodes.

CITATION LIST

Patent Literature(s)

Patent Literature 1: JP2008-270421A

SUMMARY OF THE INVENTION

Problem(s) to be Solved by the Invention

In the typical thermoelectric generation module disclosed in Patent Literature 1, since a first one of the flexible boards is in contact with a low-temperature heat source and a second one of the flexible boards is in contact with a high-temperature heat source, a degree of thermal expansion is likely to differ between the flexible substrate near the low-temperature heat source and the flexible substrate near the high-temperature heat source, whereby an external force may be applied to connection portions between the thermoelectric elements and the electrodes, or stress may be generated at the connection portions, so that the thermoelectric elements may be separated from the electrodes. Particularly, since the thermoelectric element located at an end of an electrical arrangement is surrounded by a small number of the thermoelectric elements, when an external force is applied via a lead wire, the thermoelectric elements are highly likely to be adversely affected by the external force and fall in the similar situation to the above.

An object of the invention is to provide a thermoelectric generation module capable of reliably maintaining a connection strength at connection portions between thermoelectric elements and electrodes connected thereto.

Means for Solving the Problem(s)

According to an aspect of the invention, a thermoelectric generation module including a cooling surface formed on one of a front side and a rear side and a heating surface formed on the other of the front side and the rear side includes: a plurality of thermoelectric elements; a pair of flexible boards holding the thermoelectric elements therebetween and respectively defining the cooling surface and the heating surface; a plurality of interelement electrodes provided on opposed surfaces of the flexible boards and configured to establish an electrical connection for the thermoelectric elements; a lead wire configured to establish an electrical connection for the interelement electrodes connected to one of the thermoelectric elements positioned at an end of an electrical arrangement; and a reinforcing member interposed between the flexible boards, in which the reinforcing member is closer to the drawn-out lead wire with respect to the one of the thermoelectric elements positioned at the end.

According to the above arrangement, since the reinforcing device is provided closer to the drawn-out lead wires with respect to the one of the thermoelectric elements positioned at the end of the electrical arrangement, when an external force is applied through the lead wire, a stress supposed to be generated at the connection portion between the thermoelectric elements and the interelement electrodes is dispersed to the connection portion between the reinforcing device and the flexible board. Accordingly, the stress applied on the connection portion between the thermoelectric elements and the interelement electrodes can be restrained, so that a connection strength at the connection portion between the thermoelectric elements and the interelement electrodes connected thereto can be reliable maintained.

In the thermoelectric generation module with the above arrangement, the reinforcing member preferably has a thermal property and a shape substantially the same as those of each of the thermoelectric elements.

In the thermoelectric generation module with the above arrangement, the reinforcing member is preferably the same element as each of the thermoelectric elements.

The thermoelectric generation module with the above arrangement preferably further includes: at least one of a fixation base and a reinforcing pattern, the fixation base extending on each of the opposed surfaces of the flexible boards in a direction intersecting with the lead wire and being connected with the reinforcing member, the reinforcing pattern extending on each of the opposed surfaces of the flexible boards in the direction intersecting with the lead wire and being independent of the reinforcing member.

In the thermoelectric generation module with the above arrangement, the fixation base and the reinforcing pattern as well as the interelement electrodes are preferably formed from a single conductor.

BRIEF DESCRIPTION OF DRAWING(S)

DESCRIPTION OF EMBODIMENT(S)

Figure 2:
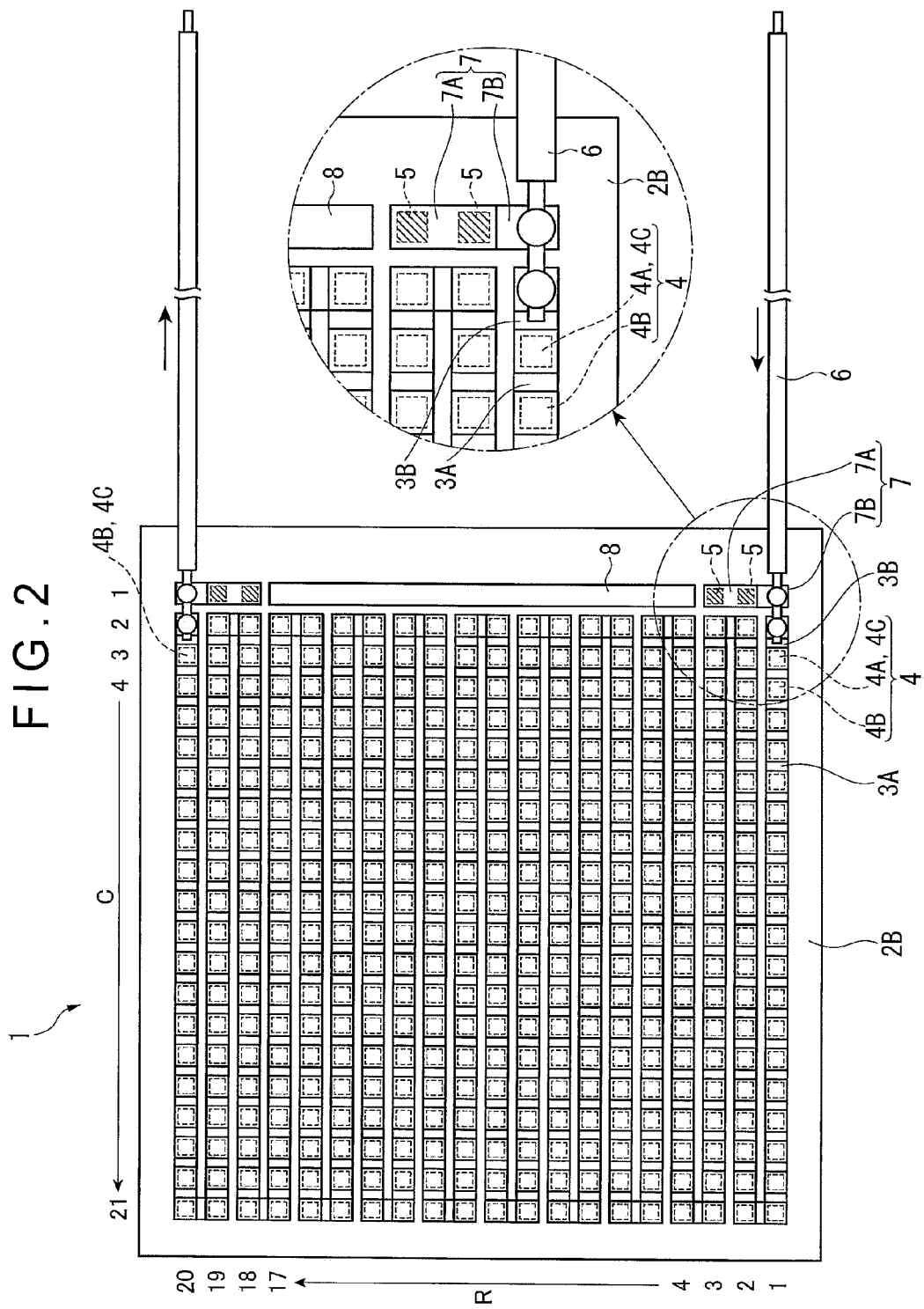
FIG. 2 is a planar cross-sectional view showing the thermoelectric generation module.
Figure 3:
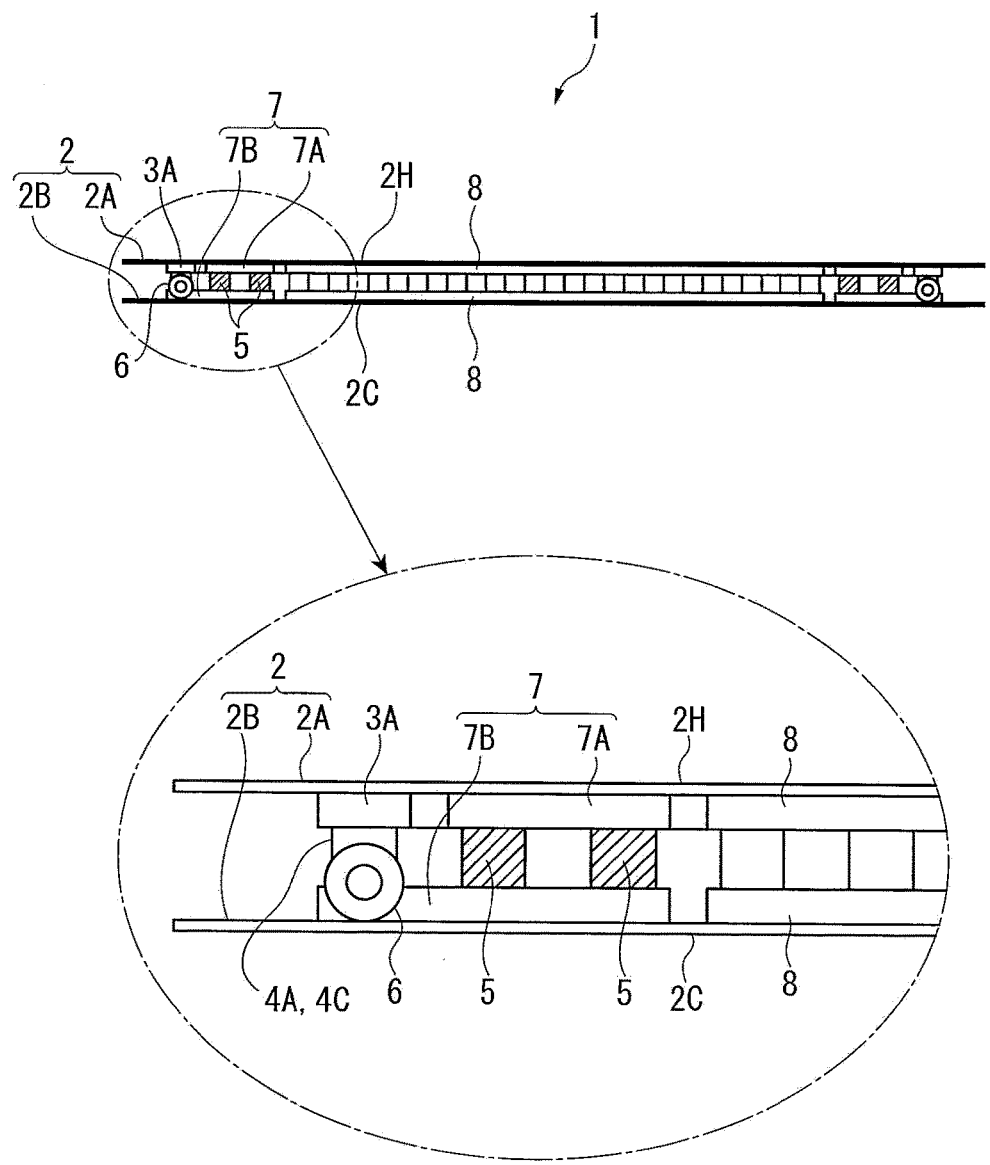
FIG. 3 is a front elevational view showing the thermoelectric generation module.

Exemplary embodiment(s) of the invention will be described below with reference to the attached FIGS. 1 to 3.

Figure 1:
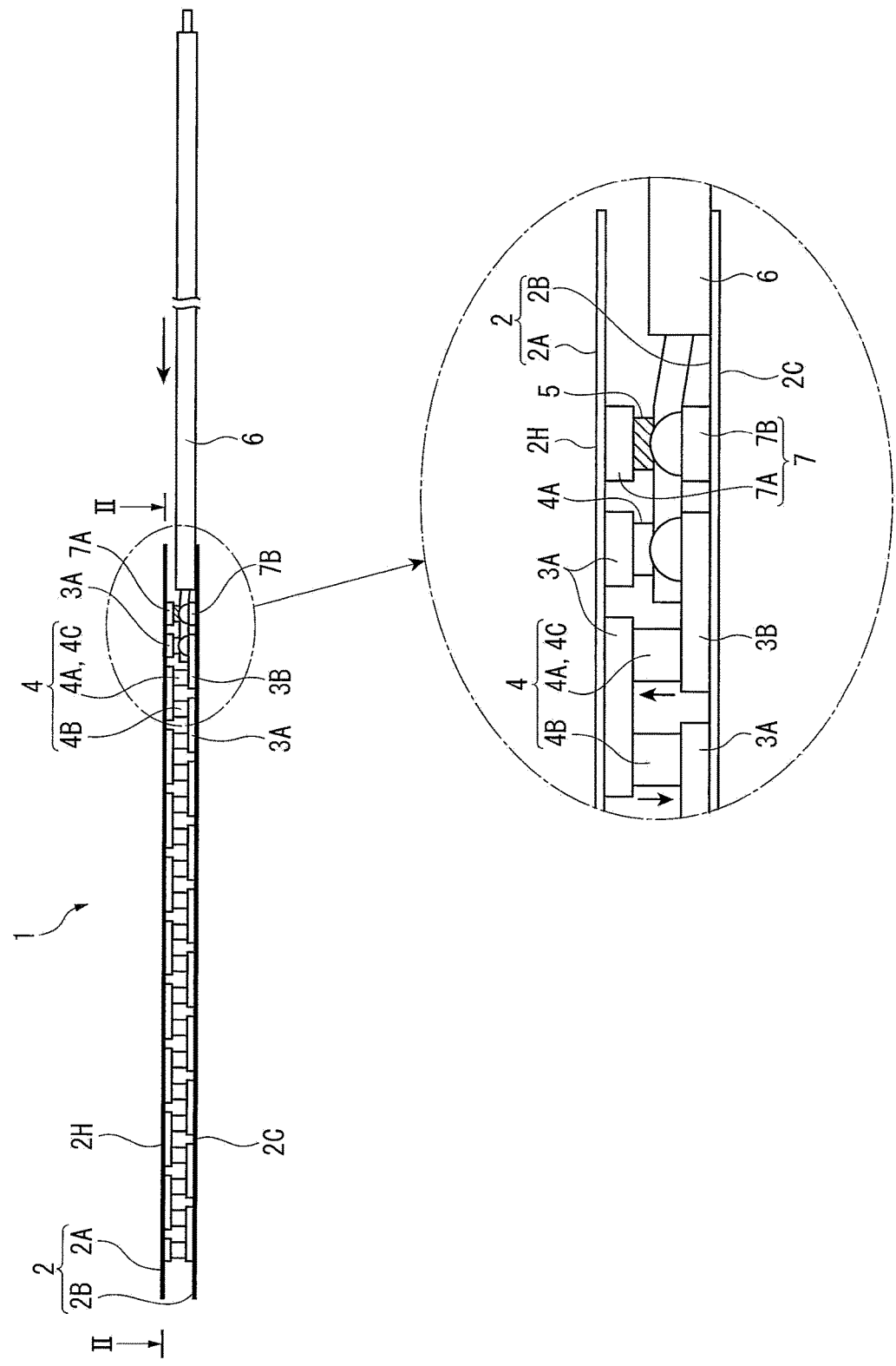
FIG. 1 is a side view showing a thermoelectric generation module according to an exemplary embodiment of the invention.

FIG. 1 is a side elevational view of a thermoelectric generation module 1 according to an exemplary embodiment of the invention. FIG. 2 is a planar cross-sectional view of the thermoelectric generation module 1 seen in a direction indicated by an arrow II in FIG. 1. FIG. 3 is a front elevational view of the thermoelectric generation module 1 seen from the right side in FIG. 1.

The thermoelectric generation module 1 includes: a plurality of thermoelectric elements 4; a pair of flexible boards 2 holding the thermoelectric elements 4 therebetween; a plurality of interelement electrodes 3A respectively provided on opposed surfaces of the flexible boards 2 and configured to electrically connect the thermoelectric elements 4 to each other; a lead wire 6 configured to be electrically connected to one of the interelement electrodes 3A connected to one of the thermoelectric elements 4 located at an end of an electrical arrangement; and a reinforcing device 5 (a reinforcing member) interposed between the flexible boards 2.

The flexible boards 2 are made of a flexible insulator (e.g., polyimide) and are provided with a low-temperature-side board 2B shown on a lower side of FIG. 1 and a high-temperature-side board 2A shown on a upper side of FIG. 1. The low-temperature-side board 2B has a cooling surface 2C in contact with a heat radiation medium. The high-temperature-side board 2A has a heating surface 2H in contact with a heat source.

The thermoelectric elements 4 include an N-type thermoelectric element 4A and a P-type thermoelectric element 4B. The N-type thermoelectric element 4A and the P-type thermoelectric element 4B are each made of, for instance, a bismuss-tellurium (Bi—Te) based material into a rectangular parallelepiped having a constant-sized square cross section. Moreover, the N-type thermoelectric element 4A and the P-type thermoelectric element 4B are alternately provided in a juxtaposed manner in a right-and-left direction in FIGS. 1 and 2. The electrical arrangement of the N-type thermoelectric element 4A and the P-type thermoelectric element 4B extends in a top direction in FIG. 2 with u-turns, so that the N-type thermoelectric element 4A and the P-type thermoelectric element 4B are provided between the entire flexible boards 2 in a manner to be aligned in the right-and-left direction and a top-and-bottom direction. As shown by arrows in FIG. 1, due to Seebeck effect, an electric current flows from a higher temperature side to a lower temperature side (i.e., upward in FIG. 1) in the N-type thermoelectric element 4A and flows from the lower temperature side to the higher temperature side (i.e., downward in FIG. 1) in the P-type thermoelectric element 4B. The thermoelectric generation module 1 generates electricity by carrying the electric current thus generated by the thermoelectric elements 4 to the lead wire 6.

In the following description regarding the arrangement of thermoelectric elements 4 between the flexible boards 2, a lateral arrangement is defined as a "row (shown by R)", a vertical arrangement is defined as a "column (shown by C)", one unit of the row and the column is defined as one section, and a bottom-right corner in FIG. 1 is defined as an origin [first row, first column]. In the exemplary embodiment, a matrix of 20 rows×21 columns is formed on the flexible boards 2. It should be noted that, in the exemplary embodiment, the thermoelectric elements 4 are provided on the second and subsequent columns.

As shown in FIG. 1, the thermoelectric generation module 1 has the Π (pi) type structure, respective upper adjacent ends of the N-type thermoelectric element 4A and the P-type thermoelectric element 4B are connected to one of the interelement electrodes 3A, and alternately, respective adjacent lower ends of the N-type thermoelectric element 4A and the P-type thermoelectric element 4B are connected to another of the interelement electrodes 3A. Connection is repeated in a sequence of the N-type thermoelectric element 4A through the interelement electrode 3A to the P-type thermoelectric element 4B, so that all the thermoelectric elements 4 are electrically connected in series. This series circuit functions as a thermoelectric generation circuit.

The thermoelectric elements 4 located at positions ([$1^{st}$ row, $3^{rd}$ column] and [$20^{th}$ row, $3^{rd}$ column]) are terminal elements 4C. The interelement electrodes 3A connecting the terminal elements 4C to the respective lead wires 6 are defined as end electrodes 3B. In the exemplary embodiment, one of the terminal elements 4C located at the position [$1^{st}$ row, $3^{rd}$ column] is defined as the N-type thermoelectric element 4A and the other of the terminal elements 4C located at the position [20$^{th}$ row, 3$^{rd}$ column]) is defined as the P-type thermoelectric element 4B. One of the end electrodes 3B is provided across two sections of [1$^{st}$ row, 2$^{nd}$ and 3$^{rd}$ columns] and the other of the end electrodes 3B is provided across two sections of [20$^{th}$ row, 2$^{nd}$ and 3$^{rd}$ columns]. Each of the lead wires 6 is soldered to each of the end electrodes 3B and a low-temperature-side fixation bases 7B(described later).

The thermoelectric element 4 which may be of the N-type thermoelectric element 4A or the P-type thermoelectric element 4B is used as a reinforcing device 5. In other words, the N-type thermoelectric element 4A, the P-type thermoelectric element 4B and the reinforcing device 5 have the same thermal properties and shapes.

As shown in FIG. 1, the total four reinforcing devices 5 are provided at sections of [2$^{nd}$ and 3$^{rd}$ rows, 1$^{st}$ column] and [18$^{th}$ and 19$^{th}$ rows, 1$^{st}$ column] included in a region of the flexible boards 2 (specifically, 1$^{st}$ and 2$^{nd}$ columns) extending in a direction of the drawn-out lead wires 6 with respect to the terminal elements 4C (i.e., the right side in the drawing).

The reinforcing devices 5 are connected to both the flexible boards 2 through a fixation base 7. The fixation base 7 reinforces the connection between the reinforcing devices 5 and the flexible boards 2. Although the connection strength between the reinforcing devices 5 and the flexible boards 2 is inherently relatively small, the connection strength is increased by interposing the fixation base 7 between the reinforcing devices 5 and the flexible boards 2.

The fixation base 7 includes two high-temperature-side fixation bases 7A provided on the opposed surface of the low-temperature-side boards 2B and two high-temperature-side fixation bases 7A provided on the opposed surface of the high-temperature-side board 2A. The high-temperature-side fixation bases 7A are provided across two sections of [2$^{nd}$ and 3$^{rd}$ rows, 1$^{st}$ column] and across two sections of [18$^{th}$ and 19$^{th}$ rows, 1$^{st}$ column]. The high-temperature-side fixation bases 7A are provided across three sections of [1$^{st}$ to 3$^{rd}$ rows, 1$^{st}$ column] and across three sections of [18$^{th}$ to 20$^{th}$ rows, 1$^{st}$ column]. Since the high-temperature-side fixation bases 7A and the high-temperature-side fixation bases 7A extend in a direction intersecting with the lead wires 6, the flexible boards 2 can be restrained from being bent in the direction (in the top-and-bottom direction in FIG. 2) intersecting with the lead wires 6 in a region that is near the terminal elements 4C and is easily affected by an external force transmitted through the lead wires 6.

On the low-temperature-side board 2B, the low-temperature-side fixation bases 7B are apart from the interelement electrodes 3A. On the high-temperature-side board 2A, the high-temperature-side fixation bases 7A are apart from the interelement electrodes 3A. In the arrangement of the reinforcing devices 5 and the fixation base 7 in the exemplary embodiment, electric current does not flow through the reinforcing devices 5.

The reinforcing pattern 8 extending in the direction intersecting with the lead wires 6 is provided in a belt shape across 14 sections of [4$^{th}$ to 17$^{th}$ rows, 1$^{st}$ column] on both the opposed surfaces of the flexible boards 2. In each of the flexible boards 2, the interelement electrode 3A, the end electrode 3B, the fixation base 7 and the reinforcing pattern 8 are formed by an etching treatment from a single piece of a conductor (e.g., copper) attached to each of the opposed surfaces of the flexible boards 2.

Although not shown in the drawings, the interelement electrode 3A, the end electrode 3B, the fixation base 7 and the reinforcing pattern 8 are formed to have a larger cross-sectional area toward respective base thereof due to characteristics of the etching treatment. In other words, a heat-radiation area and a heat-receiving area are increased. Accordingly, heat transfer to the low-temperature-side board 2B and heat transfer from the high-temperature-side board 2A are facilitated.

Moreover, since the reinforcing pattern 8 is provided in the middle of the region extending in the direction of the drawn-out lead wires 6 with respect to the terminal elements 4C, the region in which a deformation amount of the flexible boards 2 is likely to be increased can be restrained from being bent in the direction intersecting with the lead wires 6. It should be noted that electric current does not flow through the reinforcing pattern 8 since the reinforcing pattern 8 is spaced from the other electrodes and the thermoelectric elements 4.

Advantage(s) of Embodiment(s)

According to the exemplary embodiment, since the thermoelectric generation module 1 includes the reinforcing device 5 closer to the drawn-out lead wires 6 with respect to the terminal elements 4C, when an external force is applied through the lead wires 6, a stress supposed to be generated at the connection portion between the thermoelectric elements 4 and the interelement electrodes 3A is dispersed to the connection portion between the reinforcing device 5 and the fixation base 7. Accordingly, the stress applied on the connection portion between the thermoelectric elements 4 and the interelement electrodes 3A (particularly, a stress applied to the connection portion between the terminal elements 4C and the end electrodes 3B) can be inhibited, so that the connection strength at the connection portion between the thermoelectric elements 4 and the interelement electrodes 3A connected thereto can be reliably maintained.

A layout and number of the reinforcing device 5 and the resultant arrangement of the thermoelectric generation module 1 are not limited to those in the exemplary embodiment. For instance, conceivable patterns include those in Modifications 1 to 5 below.

Description of Modification 1

Figure 5:
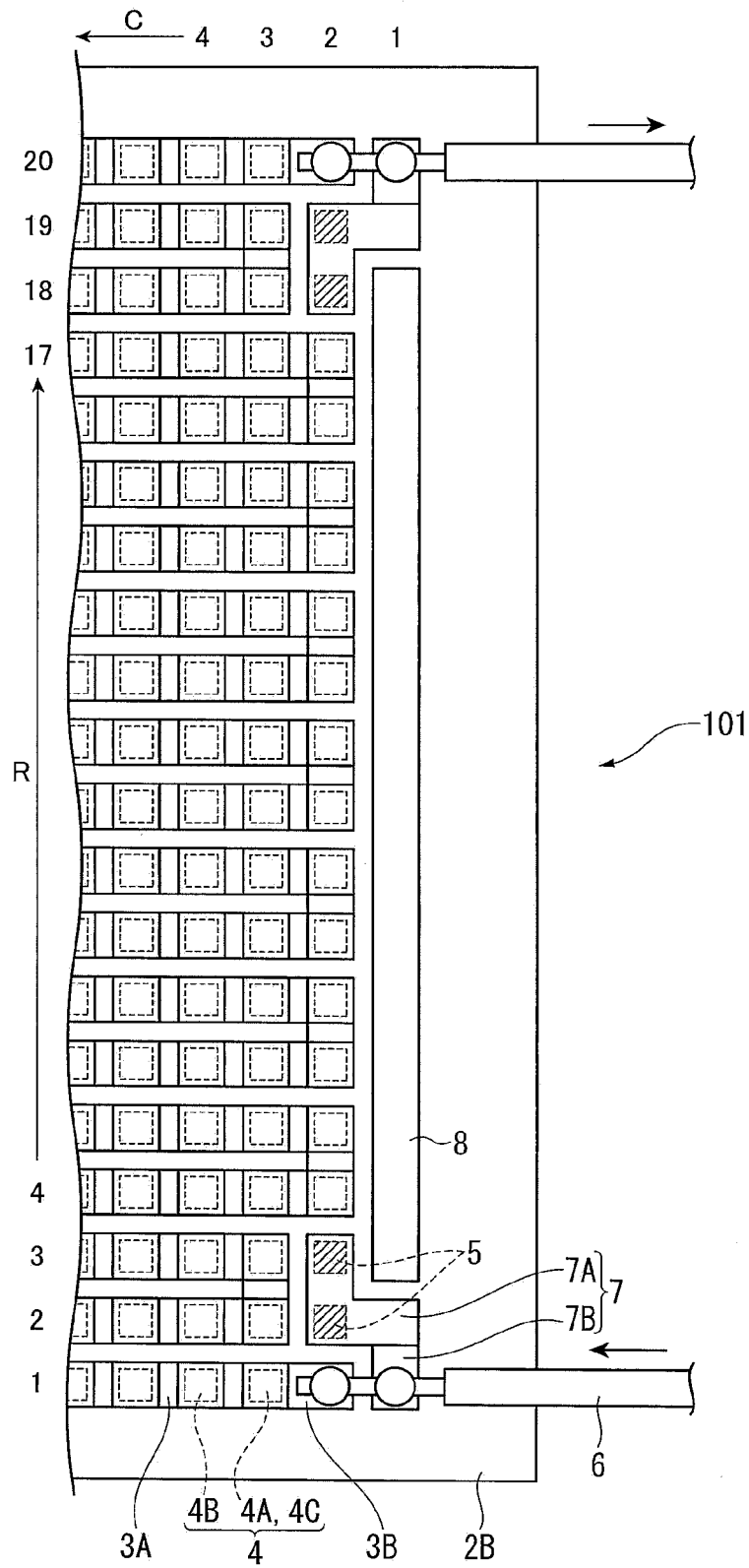
FIG. 5 is a planar cross-sectional view showing the relevant part of the thermoelectric generation module according to the modification 1.
Figure 6:
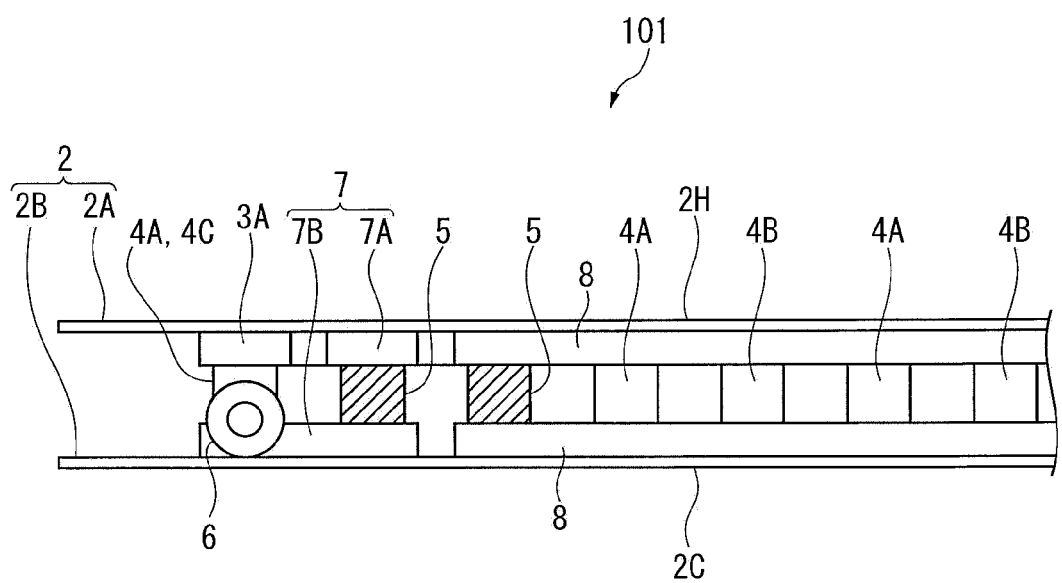
FIG. 6 is a front elevational view showing the relevant part of the thermoelectric generation module according to the modification 1.

A thermoelectric generation module 101 according to Modification 1 will be described with reference to FIGS. 4 to 6. However, the description on the same arrangement as that of the thermoelectric generation module 1 in the above exemplary embodiment will be omitted (the same applies to Modifications 2 to 5).

Figure 4:
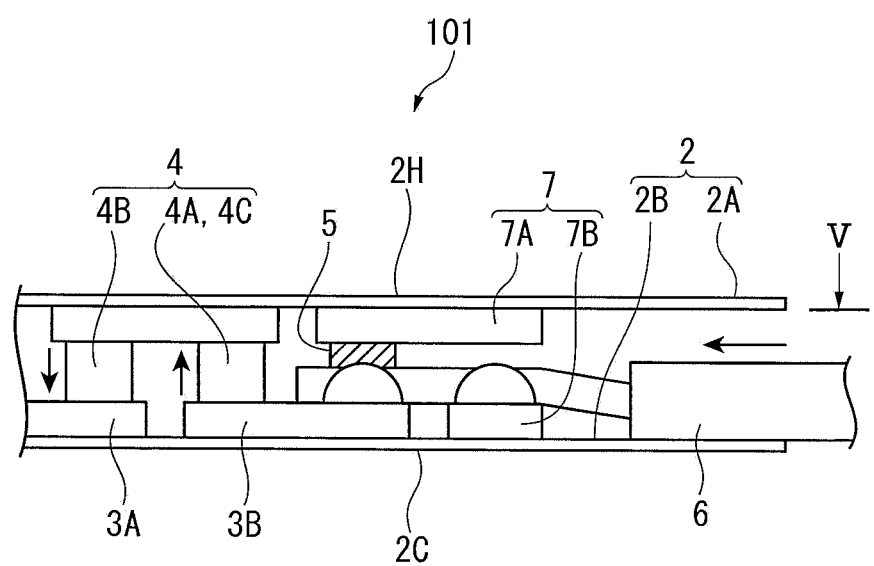
FIG. 4 is a side elevational view showing a relevant part of a thermoelectric generation module according to a modification 1.

FIG. 4 is a side elevational view of a relevant part of the thermoelectric generation module 101. FIG. 5 is a planar cross-sectional view of the relevant part of the thermoelectric generation module 101 seen in a direction indicated by an arrow V in FIG. 4. FIG. 6 is a front elevational view of the relevant part of the thermoelectric generation module 101 seen from the right side in FIG. 4.

The layout of the reinforcing device 5 and the resultant arrangement in the thermoelectric generation module 101 according to Modification 1 are different from those in the thermoelectric generation module 1 according to the above exemplary embodiment.

The terminal elements 4C of the thermoelectric generation module 101 are provided at [1$^{st}$ row, 3$^{rd}$ column] and [20$^{th}$ row, 3$^{rd}$ column] The total four reinforcing devices 5 are provided at sections of [2$^{nd}$ and 3$^{rd}$ rows, 2$^{nd}$ column] and [18$^{th}$ and 19$^{th}$ rows, 2$^{nd}$ column] closer to the drawn-out lead wires 6 with respect to the terminal elements 4C.

The high-temperature-side fixastion bases 7A are provided across three sections to form an L shape. The lowtemperature-side fixation bases 7B are provided across two sections to form a belt shape.

The end electrode 3B is provided across two sections to form a belt shape. The lead wire 6 is soldered to the end electrode 3B and the low-temperature-side fixation bases 7B at each of [$1^{st}$ row, $1^{st}$ and $2^{nd}$ columns] and [$20^{th}$ row, $1^{st}$ and $2^{nd}$ columns].

The reinforcing pattern 8 is provided in a belt shape across 16 sections of [$3^{rd}$ to $18^{th}$ rows, $1^{st}$ column] on both the opposed surfaces of the flexible boards 2.

Description of Modification 2

Figure 8:
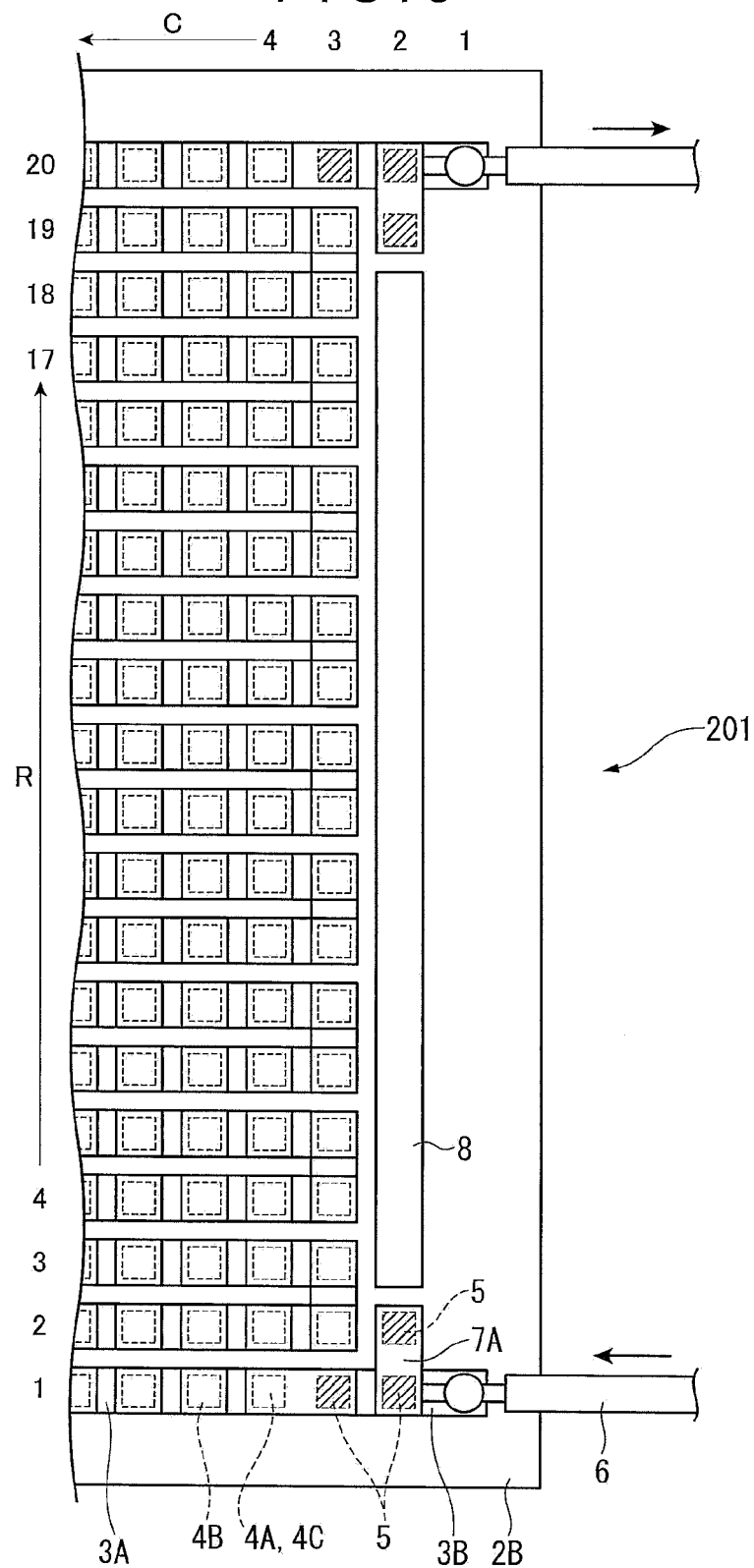
FIG. 8 is a planar cross-sectional view showing the relevant part of the thermoelectric generation module according to the modification 2.
Figure 9:
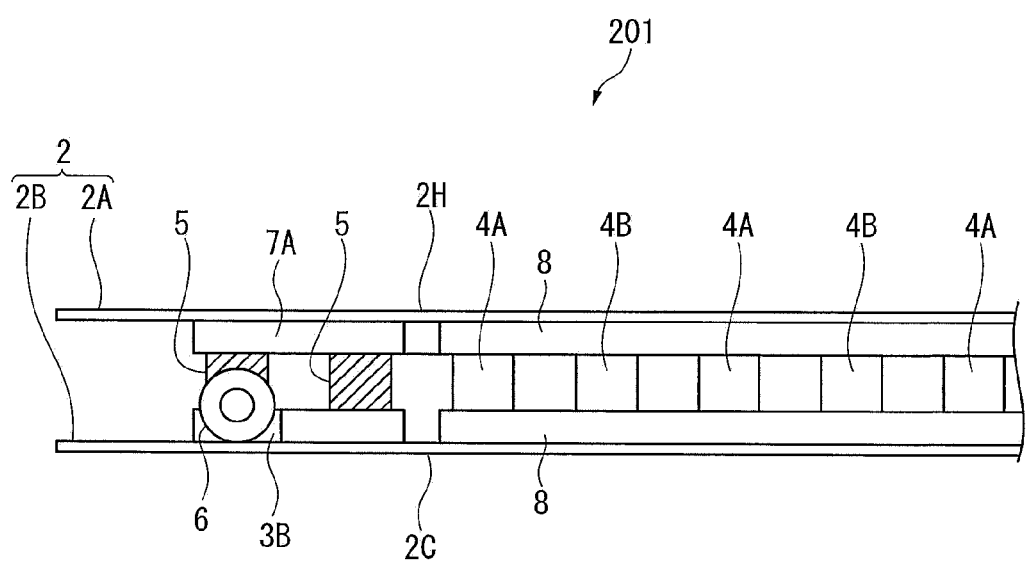
FIG. 9 is a front elevational view showing the relevant part of the thermoelectric generation module according to the modification 2.

A thermoelectric generation module 201 according to Modification 2 will be described with reference to FIGS. 7 to 9.

Figure 7:
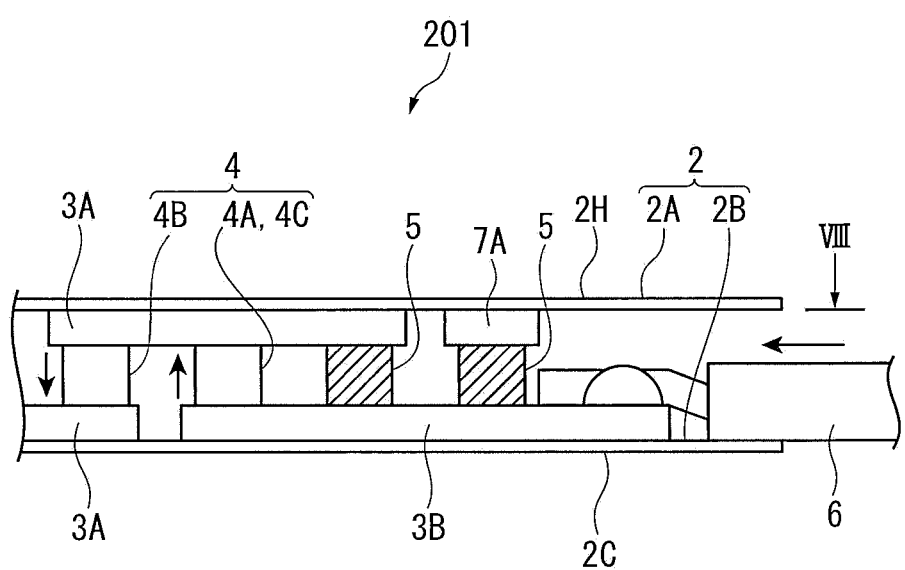
FIG. 7 is a side elevational view showing a relevant part of a thermoelectric generation module according to a modification 2.

FIG. 7 is a side elevational view of a relevant part of the thermoelectric generation module 201. FIG. 8 is a planar cross-sectional view of the relevant part of the thermoelectric generation module 201 seen in a direction indicated by an arrow VIII in FIG. 7. FIG. 9 is a front elevational view of the relevant part of the thermoelectric generation module 201 seen from the right side in FIG. 7.

The terminal elements 4C of the thermoelectric generation module 201 are provided at [$1^{st}$ row, $4^{th}$ column] and [$20^{th}$ row, $4^{th}$ column] The total six reinforcing devices 5 are provided at sections of [$1^{st}$ row, $2^{nd}$ and $3^{rd}$ columns], [$2^{nd}$ row, $2^{nd}$ column], [$20^{th}$ row, $2^{nd}$ and $3^{rd}$ columns] and [$19^{th}$ row, $2^{nd}$ column] closer to the drawn-out lead wires 6 with respect to the terminal elements 4C.

The high-temperature-side fixation bases 7A are provided in a belt shape across two sections. However, in Modification 2, the end electrode 3B extends while no low-temperature-side fixation bases 7B exists. A single terminal element 4C and three reinforcing devices 5 are connected to each of the end electrodes 3B. Each of the end electrodes 3B is formed substantially in a T shape to connect the single terminal element 4C and the three reinforcing devices 5.

The lead wire 6 is soldered to each of the end electrodes 3B at [$1^{st}$ row, $1^{st}$ column] and [$20^{th}$ row, $1^{st}$ column]. As shown in FIG. 8, the reinforcing devices 5 are disposed between the soldered portion of the lead wire 6 and the terminal elements 4C.

The reinforcing pattern 8 is provided in a belt shape across 16 sections of [$3^{rd}$ to $18^{th}$ rows, $1^{st}$ column] on both the opposed surfaces of the flexible boards 2.

Description of Modification 3

Figure 11:
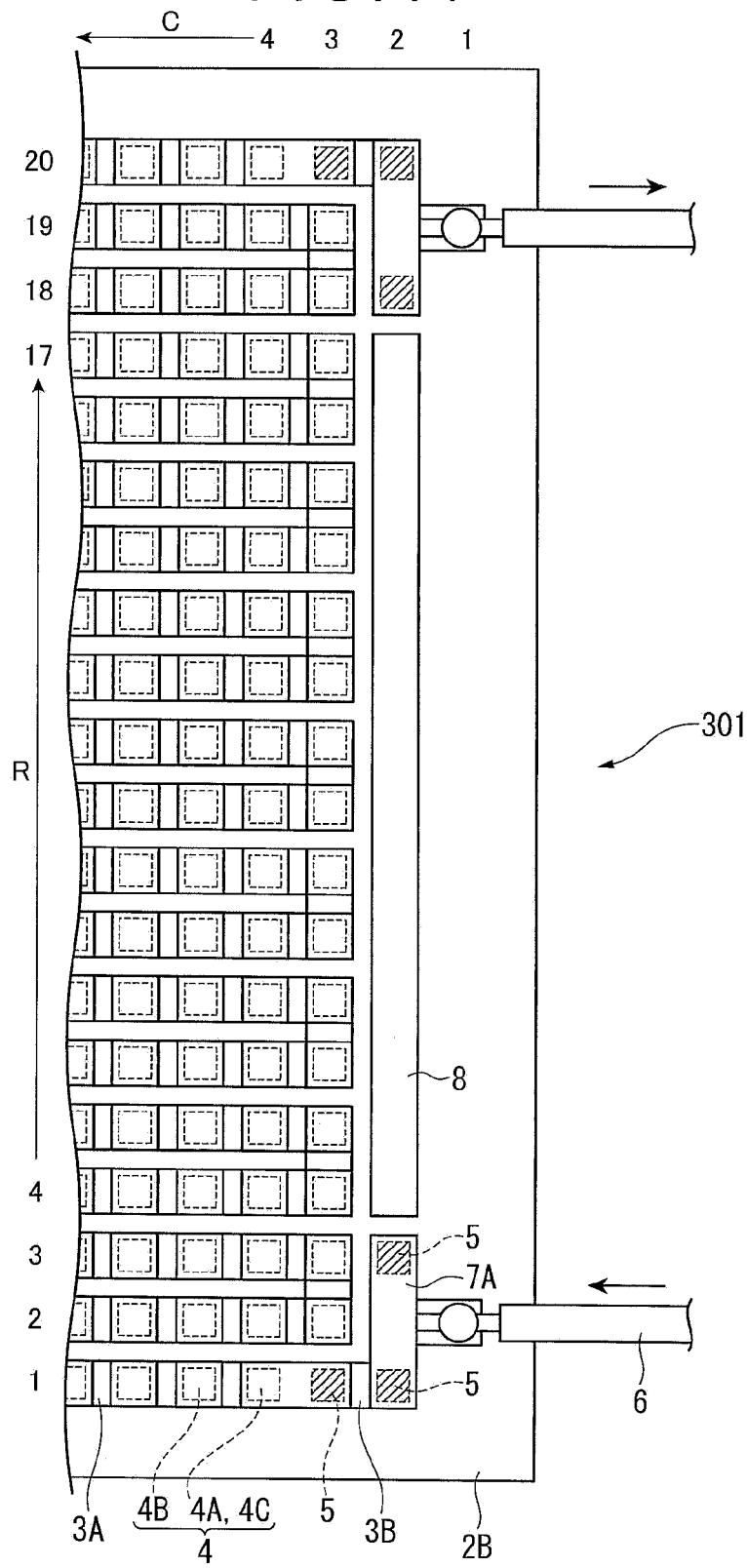
FIG. 11 is a planar cross-sectional view showing the relevant part of the thermoelectric generation module according to the modification 3.
Figure 12:
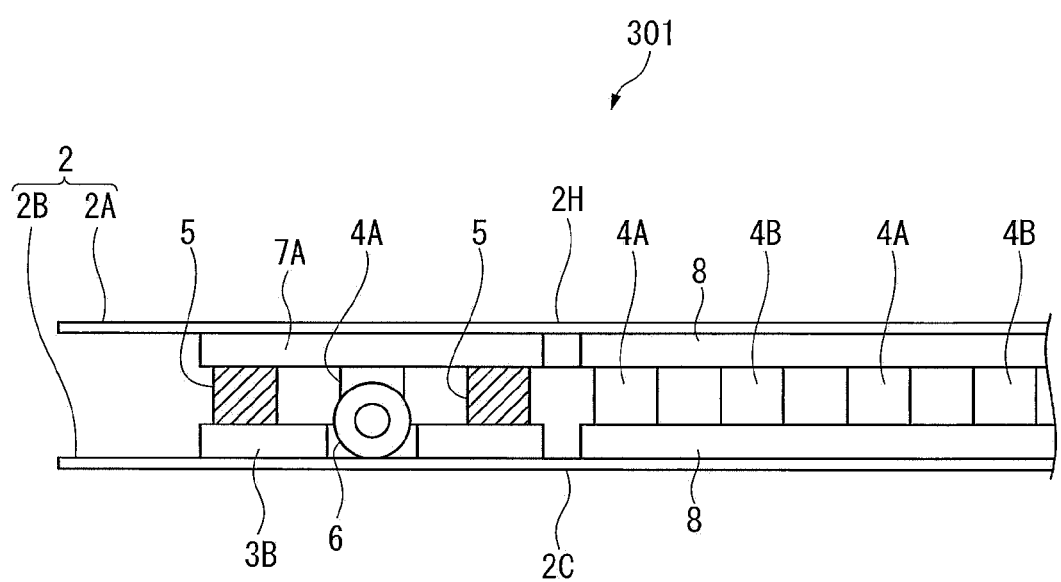
FIG. 12 is a front elevational view showing the relevant part of the thermoelectric generation module according to the modification 3.

A thermoelectric generation module 301 according to Modification 3 will be described with reference to FIGS. 10 to 12.

Figure 10:
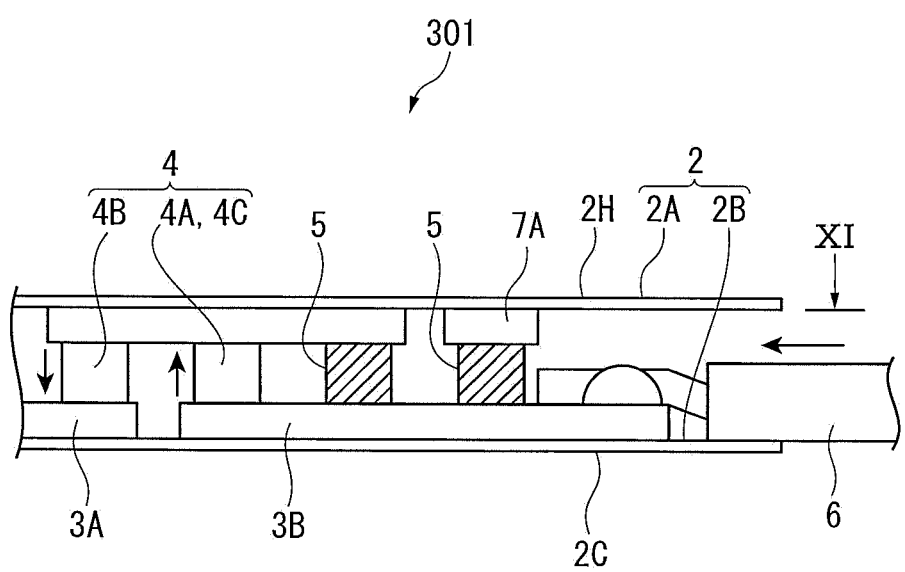
FIG. 10 is a side elevational view showing a relevant part of a thermoelectric generation module according to a modification 3.

FIG. 10 is a side elevational view of a relevant part of the thermoelectric generation module 301. FIG. 11 is a planar cross-sectional view of the relevant part of the thermoelectric generation module 301 seen in a direction indicated by an arrow XI in FIG. 10. FIG. 12 is a front elevational view of the relevant part of the thermoelectric generation module 301 seen from the right side in FIG. 10.

The terminal elements 4C of the thermoelectric generation module 301 are provided at [$1^{st}$ row, $4^{th}$ column] and [$20^{th}$ row, $4^{th}$ column]. The total six reinforcing devices 5 are provided at sections of [$1^{st}$ row, $2^{nd}$ and $3^{rd}$ columns]. [$3^{rd}$ row, $2^{nd}$ column], [$20^{th}$ row, $2^{nd}$ and $3^{rd}$ columns] and [$18^{th}$ row, $2^{nd}$ column] closer to the drawn-out lead wires 6 with respect to the terminal elements 4C.

The high-temperature-side fixaton bases 7A are provided in a belt shape across three sections. Also in Modification 3, the low-temperature-side fixation bases 7B is integrated with the end electrode 3B. A single terminal element 4C and three reinforcing devices 5 are connected to each of the end electrodes 3B. Each of the end electrodes 3B is formed substantially in an L shape to connect the single terminal element 4C and the three reinforcing devices 5.

The lead wire 6 is soldered to each of the end electrodes 3B at [$2^{nd}$ row, $1^{st}$ column] and [$19^{th}$ row, $1^{st}$ column]. In other words, the lead wire 6 is soldered to each of the end electrodes 3B at the adjacent row to the terminal elements 4C. As shown in FIG. 11, the reinforcing devices 5 are disposed between the soldered portion of the lead wire 6 and the terminal elements 4C.

The reinforcing pattern 8 is provided in a belt shape across 14 sections of [$4^{th}$ to $17^{th}$ rows, $2^{nd}$ column] on both the opposed surfaces of the flexible boards 2.

Description of Modification 4

Figure 14:
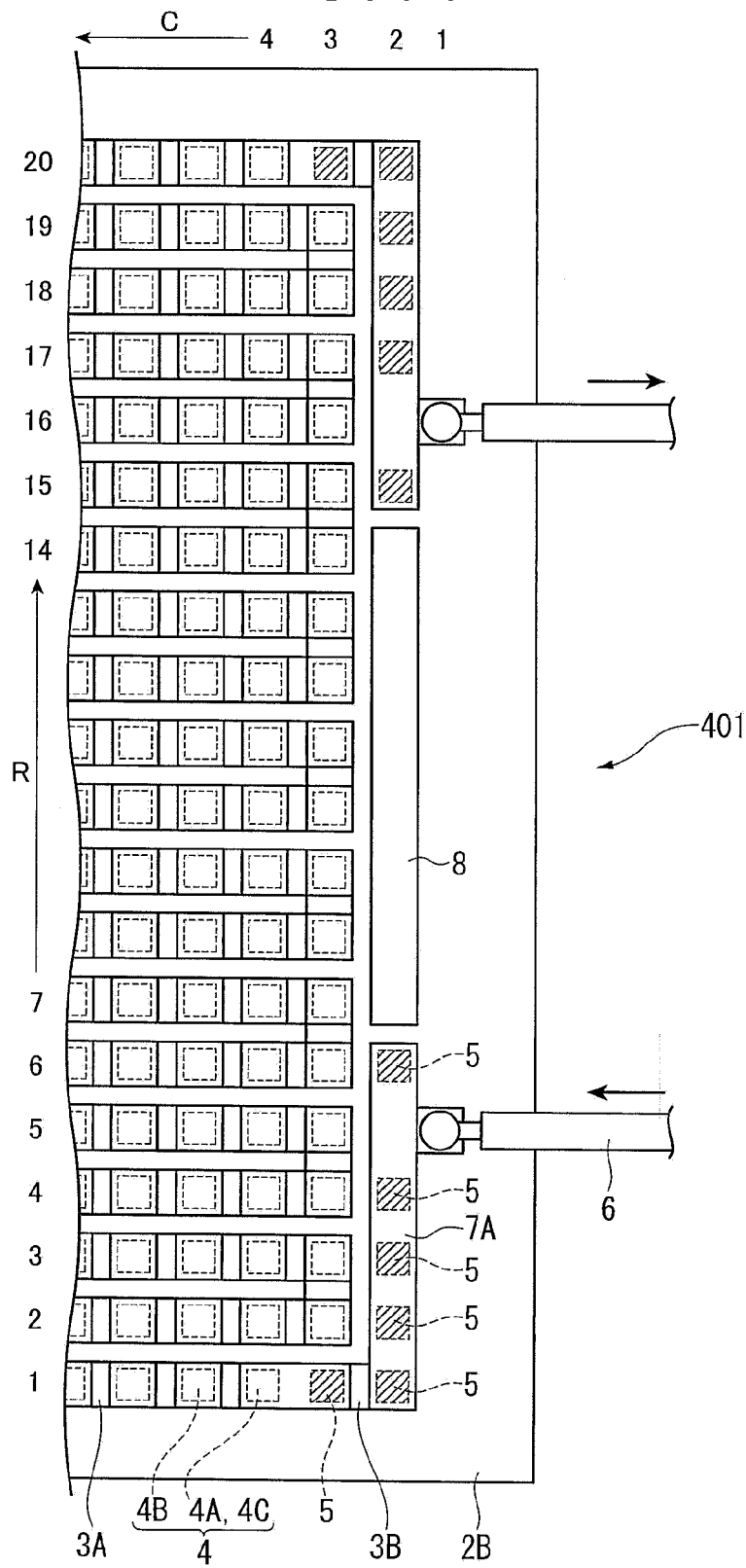
FIG. 14 is a planar cross-sectional view showing the relevant part of the thermoelectric generation module according to the modification 4.
Figure 15:
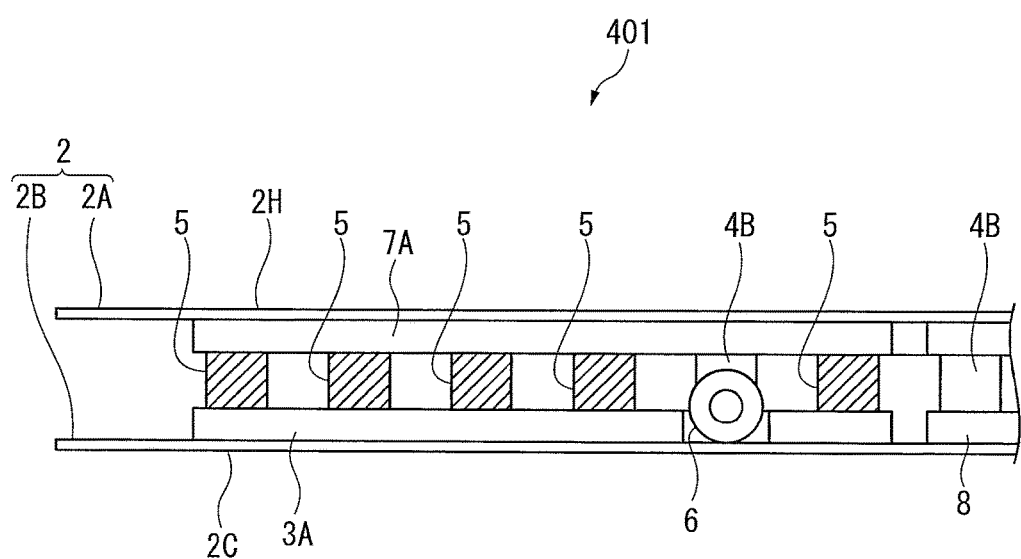
FIG. 15 is a front elevational view showing the relevant part of the thermoelectric generation module according to the modification 4.

A thermoelectric generation module 401 according to Modification 4 will be described with reference to FIGS. 13 to 15.

Figure 13:
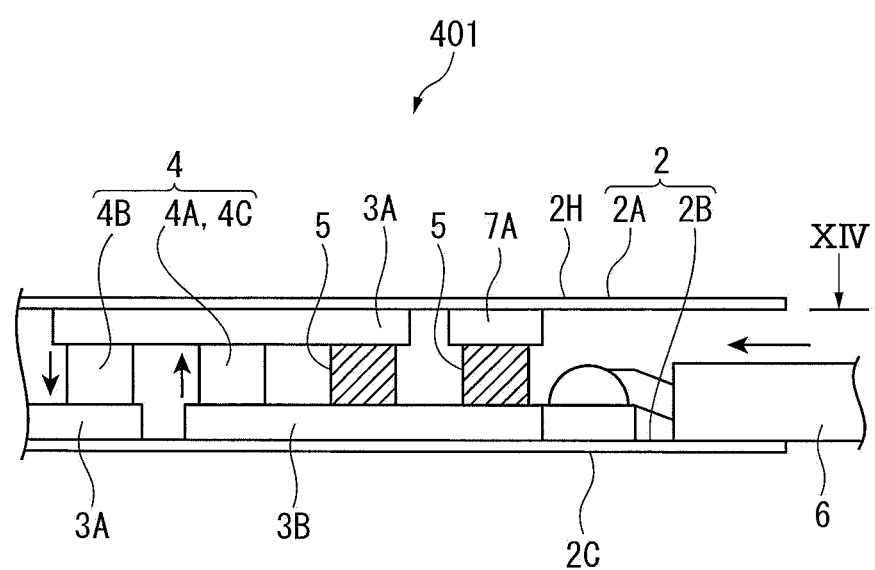
FIG. 13 is a side elevational view showing a relevant part of a thermoelectric generation module according to a modification 4.

FIG. 13 is a side elevational view of a relevant part of the thermoelectric generation module 401. FIG. 14 is a planar cross-sectional view of the relevant part of the thermoelectric generation module 401 seen in a direction indicated by an arrow XIV in FIG. 13. FIG. 15 is a front elevational view of the relevant part of the thermoelectric generation module 401 seen from the right side in FIG. 13.

The terminal elements 4C of the thermoelectric generation module 401 are provided at [$1^{st}$ row, $4^{th}$ column] and [$20^{th}$ row, $4^{th}$ column]. The total 12 reinforcing devices 5 are provided at sections of [$1^{st}$ row, $3^{rd}$ column], [$1^{st}$ to $4^{th}$ and $6^{th}$ rows, $2^{nd}$ column], [$20^{th}$ row, $3^{rd}$ column] and [$15^{th}$ and $17^{th}$ to $20^{th}$ row, $2^{nd}$ column] closer to the drawn-out lead wires 6 with respect to the terminal elements 4C.

The low-temperature-side fixation bases 7B are provided in a belt shape across six sections. Also in Modification 4, the low-temperature-side fixation bases 7B is integrated with the end electrode 3B. A single terminal element 4C and six reinforcing devices 5 are connected to each of the end electrodes 3B. Each of the end electrodes 3B is formed substantially in an L shape to connect the single terminal element 4C and the six reinforcing devices 5.

The lead wire 6 is soldered to each of the end electrodes 3B at [$5^{th}$ row, $1^{st}$ column] and [$16^{th}$ row, $1^{st}$ column]. In other words, the lead wire 6 is soldered to each of the end electrodes 3B at the fourth row next to the terminal element 4C. Accordingly, as shown in FIG. 14, the reinforcing devices 5 are disposed between the soldered portion of the lead wire 6 and the terminal element 4C while sandwiching the soldered portion of the lead wire 6.

The reinforcing pattern 8 is provided in a belt shape across 8 sections of [$7^{th}$ to $14^{th}$ rows, $2^{nd}$ column] on both the opposed surfaces of the flexible boards 2.

Description of Modification 5

Figure 17:
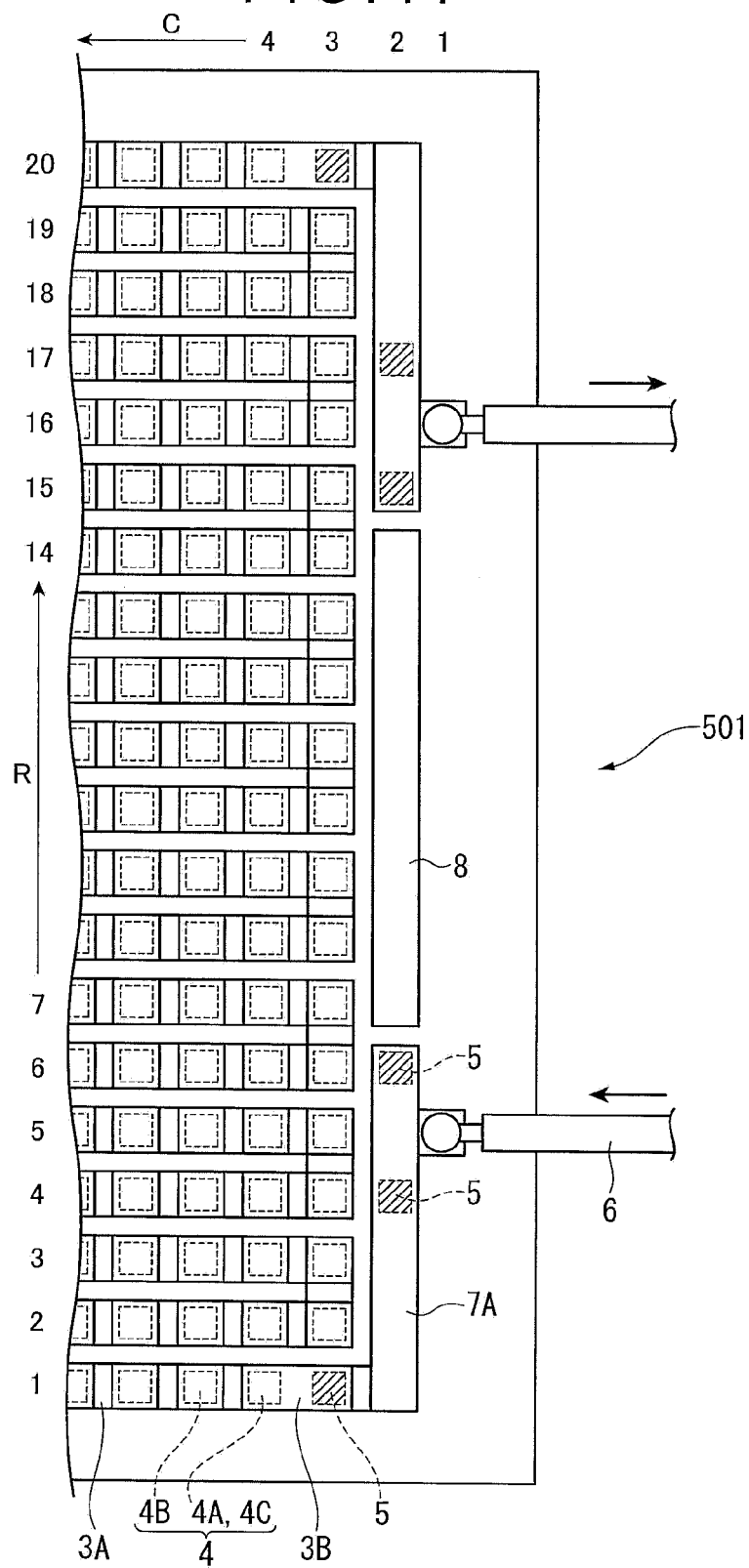
FIG. 17 is a planar cross-sectional view showing the relevant part of the thermoelectric generation module according to the modification 5.
Figure 18:
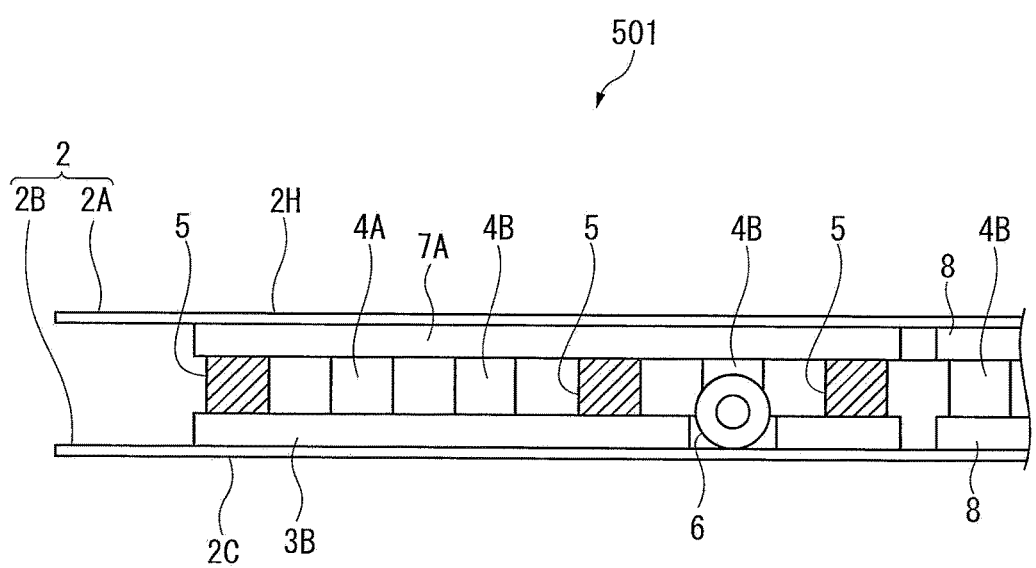
FIG. 18 is a front elevational view showing the relevant part of the thermoelectric generation module according to the modification 5.

A thermoelectric generation module 501 according to Modification 5 will be described with reference to FIGS. 16 to 18.

Figure 16:
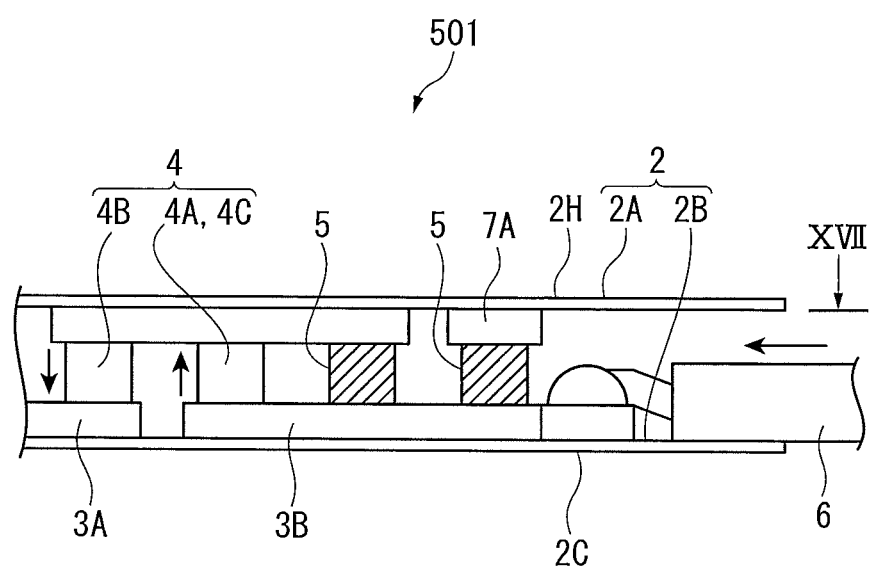
FIG. 16 is a side elevational view showing a relevant part of a thermoelectric generation module according to a modification 5.

FIG. 16 is a side elevational view of a relevant part of the thermoelectric generation module 501. FIG. 17 is a planar cross-sectional view of the relevant part of the thermoelectric generation module 501 seen in a direction indicated by an arrow XVII in FIG. 16. FIG. 18 is a front elevational view of the relevant part of the thermoelectric generation module 501 seen from the right side in FIG. 16.

The terminal elements 4C of the thermoelectric generation module 501 are provided at [$1^{st}$ row, $4^{th}$ column] and [$20^{th}$ row, $4^{th}$ column] The total 6 reinforcing devices 5 are provided at sections of [$1^{st}$ row, $3^{rd}$ column], [$4^{th}$ and $6^{th}$ rows, $2^{nd}$ column], [$20^{th}$ row, $3^{rd}$ column] and [$15^{th}$ and $17^{th}$ row, $2^{nd}$ column] closer to the drawn-out lead wires 6 with respect to the terminal elements 4C.

The low-temperature-side fixation bases 7B are provided in a belt shape across six sections. Also in Modification 5, the low-temperature-side fixation bases 7B is integrated with the end electrode 3B. A single terminal element 4C and six reinforcing devices 5 are connected to each of the end electrodes 3B. Each of the end electrodes 3B is formed substantially in an L shape to connect the single terminal element 4C and the six reinforcing devices 5.

The lead wire 6 is soldered to each of the end electrodes 3B at [$5^{th}$ row, $1^{st}$ column] and [$16^{th}$ row, $1^{st}$ column]. In other words, the lead wire 6 is soldered to each of the end electrodes 3B at the fourth row next to the terminal elements 4C. Accordingly, as shown in FIG. 17, the reinforcing devices 5 are disposed between the soldered portion of the lead wire 6 and the terminal element 4C while sandwiching the soldered portion of the lead wire 6.

The reinforcing pattern 8 is provided in a belt shape across 8 sections of [$7^{th}$ to $14^{th}$ rows, $2^{nd}$ column] on both the opposed surfaces of the flexible boards 2.

Advantage(s) of Modification(s)

In the above Modifications 1 to 5, the layout of the reinforcing devices 5 and the connection position of the lead wire are different from those in the above exemplary embodiment. However, in the same manner as in the above exemplary embodiment, the stress applied on the connection portion between the thermoelectric elements 4 and the interelement electrodes 3A can be restrained, so that the connection strength at the connection portion between the thermoelectric elements 4 and the interelement electrodes 3A connected thereto can be reliably maintained.

The scope of the invention is not limited to the above exemplary embodiment and Modifications, but includes modifications and improvements as long as an object of the invention can be achieved.

Although the thermoelectric elements 4 are used as the reinforcing devices 5 in the above exemplary embodiment and Modifications, for instance, an alternative member having substantially the same thermal property and shape as those of the thermoelectric elements 4 may be used.

Although the reinforcing devices 5 do not generate electricity in the above exemplary embodiment and Modifications, it is only necessary that the thermoelectric elements 4 can generate electricity even when the reinforcing devices 5 are peeled off from the fixation base 7, in which the reinforcing devices 5 may assist generation of electricity.

The invention claimed is:

1. A thermoelectric generation module comprising a cooling surface formed on one of a front side and a rear side and a heating surface formed on the other of the front side and the rear side, the thermoelectric generation module comprising:
    a plurality of thermoelectric elements;
    a pair of flexible boards holding the thermoelectric elements therebetween and respectively defining the cooling surface and the heating surface;
    a plurality of interelement electrodes provided on opposed surfaces of the flexible boards and configured to establish an electrical connection for the thermoelectric elements;
    a lead wire configured to establish an electrical connection for the interelement electrodes connected to one of the thermoelectric elements positioned at an end of an electrical arrangement;
    a reinforcing member interposed between the flexible boards; and
    at least one of a fixation base or a reinforcing pattern, the fixation base extending on each of the opposed surfaces of the flexible boards in a direction intersecting with the lead wire and being connected with the reinforcing member, the reinforcing pattern extending on each of the opposed surfaces of the flexible boards in the direction intersecting with the lead wire and being independent of the reinforcing member,
    wherein the reinforcing member is positioned closer to the drawn-out lead wire than to the one of the thermoelectric elements positioned at the end, and
    wherein electric current does not flow through the reinforcing member.

2. A thermoelectric generation module comprising a cooling surface formed on one of a front side and a rear side and a heating surface formed on the other of the front side and the rear side, the thermoelectric generation module comprising:
    a plurality of thermoelectric elements;
    a pair of flexible boards holding the thermoelectric elements therebetween and respectively defining the cooling surface and the heating surface;
    a plurality of interelement electrodes provided on opposed surfaces of the flexible boards and configured to establish an electrical connection for the thermoelectric elements;
    a lead wire configured to establish an electrical connection for the interelement electrodes connected to one of the thermoelectric elements positioned at an end of an electrical arrangement;
    a reinforcing member interposed between the flexible boards; and
    at least one of a fixation base or a reinforcing pattern, the fixation base extending on each of the opposed surfaces of the flexible boards in a direction intersecting with the lead wire and being connected with the reinforcing member, the reinforcing pattern extending on each of the opposed surfaces of the flexible boards in the direction intersecting with the lead wire and being independent of the reinforcing member,
    wherein the reinforcing member is positioned closer to the drawn-out lead wire than to the one of the thermoelectric elements positioned at the end,
    wherein the thermoelectric generation module includes the fixation base and the reinforcing pattern, and
    wherein electric current does not flow through the reinforcing pattern.

3. The thermoelectric generation module according to claim 1, wherein
    the reinforcing member has a thermal property and a shape substantially the same as those of each of the thermoelectric elements.

4. The thermoelectric generation module according to claim 3, wherein
    the reinforcing member is the same element as each of the thermoelectric elements.

5. The thermoelectric generation module according to claim 1, wherein
    the fixation base and the reinforcing pattern as well as the interelement electrodes are formed from a single conductor.

6. The thermoelectric generation module according to claim 2, wherein
    the reinforcing pattern is in a belt shape.

7. The thermoelectric generation module according to claim 2, wherein the fixation base is spaced apart from the plurality of interelement electrodes.

8. The thermoelectric generation module according to claim 2, wherein
the reinforcing pattern is spaced apart from the plurality of interelement electrodes.

9. The thermoelectric generation module according to claim 2, wherein
the reinforcing member has a thermal property and a shape substantially the same as those of each of the thermoelectric elements.

10. The thermoelectric generation module according to claim 9, wherein
the reinforcing member is the same element as each of the thermoelectric elements.

11. The thermoelectric generation module according to claim 2, wherein
the fixation base and the reinforcing pattern as well as the interelement electrodes are formed from a single conductor.

* * * * *